(12) United States Patent
Li

(10) Patent No.: US 10,541,314 B2
(45) Date of Patent: Jan. 21, 2020

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/003,949

(22) Filed: Jun. 8, 2018

(65) Prior Publication Data

US 2018/0366555 A1   Dec. 20, 2018

(30) Foreign Application Priority Data

Jun. 14, 2017 (CN) .......................... 2017 1 0447863

(51) Int. Cl.
*H01L 29/66* (2006.01)
*H01L 21/3213* (2006.01)
*H01L 21/3205* (2006.01)
*H01L 21/8234* (2006.01)
*H01L 21/768* (2006.01)
(Continued)

(52) U.S. Cl.
CPC ...... *H01L 29/665* (2013.01); *H01L 21/26506* (2013.01); *H01L 21/324* (2013.01); *H01L 21/32053* (2013.01); *H01L 21/32135* (2013.01); *H01L 21/76889* (2013.01); *H01L 21/76897* (2013.01); *H01L 21/823431* (2013.01); *H01L 21/823437* (2013.01); *H01L 23/5226* (2013.01); *H01L 27/0886* (2013.01); *H01L 29/0847* (2013.01); *H01L 29/36* (2013.01); *H01L 29/45* (2013.01); *H01L 29/66545* (2013.01); *H01L 21/2257* (2013.01); *H01L 21/76843* (2013.01); *H01L 21/823418* (2013.01); *H01L 21/823475* (2013.01); *H01L 29/167* (2013.01)

(58) Field of Classification Search
CPC ......................... H01L 29/665; H01L 21/26506
See application file for complete search history.

(56) References Cited

U.S. PATENT DOCUMENTS 8,835,995 B2 * 9/2014 Kang ................... H01L 21/0245
257/288
2016/0343825 A1 * 11/2016 Bae ....................... H01L 29/665

* cited by examiner

*Primary Examiner* — Marc Anthony Armand
(74) *Attorney, Agent, or Firm* — Anova Law Group, PLLC

(57) ABSTRACT

A method for fabricating a semiconductor device includes providing a base substrate, forming a plurality of doped regions in the base substrate, forming an initial capping layer covering surfaces of the plurality of doped regions, forming a dielectric layer on the initial capping layer and the base substrate, forming a plurality of vias in the dielectric layer to expose a surface portion of the initial capping layer, and etching the exposed surface portion of the initial capping layer at a bottom of each via to form a silicide region exposed at the bottom of the via. The silicide region has a reduced thickness compared with a thickness of the initial capping layer. The method further includes forming a metal silicide layer by performing a self-aligned silicide process on an entire silicide region. The metal silicide layer is in contact with the plurality of doped regions.

14 Claims, 5 Drawing Sheets

(51) Int. Cl.
*H01L 29/45* (2006.01)
*H01L 29/36* (2006.01)
*H01L 29/08* (2006.01)
*H01L 21/265* (2006.01)
*H01L 23/522* (2006.01)
*H01L 27/088* (2006.01)
*H01L 21/324* (2006.01)
*H01L 21/225* (2006.01)
*H01L 29/167* (2006.01)

SEMICONDUCTOR DEVICES AND FABRICATION METHODS THEREOF

CROSS-REFERENCES TO RELATED APPLICATIONS

This application claims the priority of Chinese Patent Application No. CN201710447863.7, filed on Jun. 14, 2017, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

Metal-oxide-semiconductor (MOS) transistor is one of the most important component in modern integrated circuits (ICs). The basic structure of a MOS transistor includes a semiconductor substrate, a gate structure on the surface of the semiconductor substrate, a source region in the semiconductor substrate on one side of the gate structure, and a drain region in the semiconductor substrate on the other side of the gate structure. To operate the MOS transistor, a switching signal may be generated by applying a voltage across the gate structure to control the current in a channel under the gate structure.

However, the performance of existing MOS transistors still needs to be improved. The disclosed semiconductor devices and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a base substrate, forming a plurality of doped regions in the base substrate, forming an initial capping layer covering surfaces of the plurality of doped regions, forming a dielectric layer on the initial capping layer and the base substrate, forming a plurality of vias in the dielectric layer to expose a surface portion of the initial capping layer, and etching the exposed surface portion of the initial capping layer at a bottom of each via to form a silicide region exposed at the bottom of the via. The silicide region has a reduced thickness compared with a thickness of the initial capping layer. The method further includes forming a metal silicide layer by performing a self-aligned silicide process on an entire silicide region. The metal silicide layer is in contact with the plurality of doped regions.

Another aspect of the present disclosure provides a semiconductor device. The semiconductor device includes a base substrate, a plurality of doped regions formed in the base substrate, and a target capping layer formed on surfaces of the doped regions. The target capping layer includes a silicide region and a non-silicide region surrounding the silicide region, and the silicide region has a reduced thickness compared with a thickness of the non-silicide region. The semiconductor device also includes a metal silicide layer formed in the silicide region of the target capping layer and having the reduced thickness, a dielectric layer formed on the target capping layer and the base substrate, and a plurality of vias formed in the dielectric layer and connected to the metal silicide layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
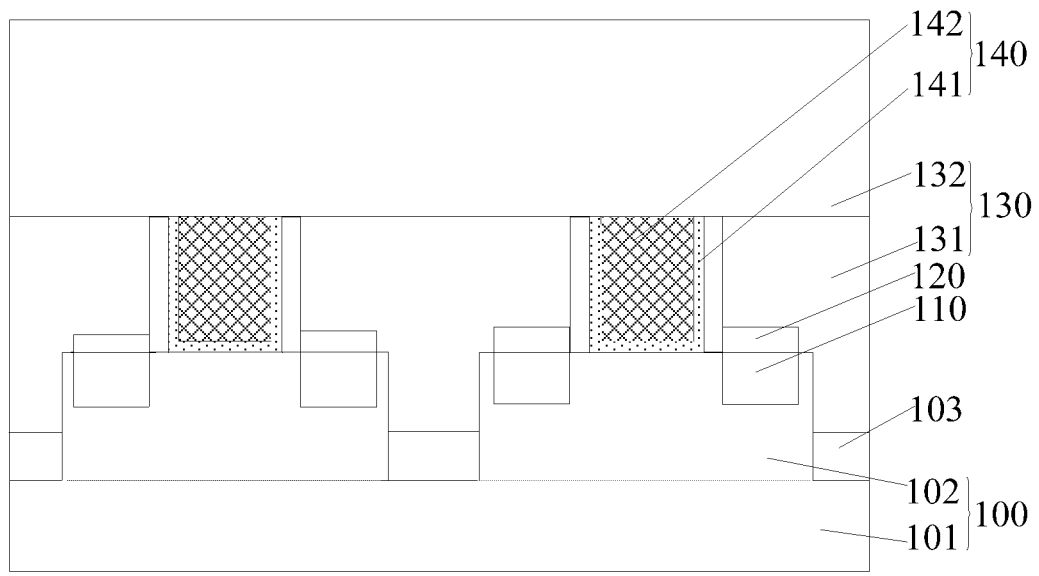
FIGS. 1-8 illustrate schematic views of semiconductor structures at certain stages of an exemplary fabrication method for a semiconductor device consistent with various embodiments of the present disclosure.

Reference will now be made in detail to exemplary embodiments of the invention, which are illustrated in the accompanying drawings. Wherever possible, the same reference numbers will be used throughout the drawings to refer to the same or like parts.

A semiconductor device may include a plurality of doped regions formed in a substrate, and a capping layer formed on the surface of the plurality of discrete doped regions. The capping layer contains conductive ions, and the conductive ions in the capping layer are used to diffuse into the doped regions through an annealing process. Moreover, a dielectric layer is formed on the capping layer and the substrate. The semiconductor device may also be formed by forming a plurality of vias through the dielectric layer to expose a portion of the surface of the capping layer, forming a metal silicide layer on the capping layer at the bottom of the vias through a self-aligned silicide process, and then forming a plurality of plugs in the vias. The metal silicide layer is in contact with each of the plurality of plugs.

The self-aligned silicide process includes forming a metal layer on the surface of the capping layer at the bottom of the vias, and performing an annealing process to allow the metal layer and the capping layer to react with each other, and thus form the metal silicide layer.

In this process, the metal silicide layer needs to be in direct contact with the doped regions, that is, the capping layer between the plugs and the doped regions needs to be fully converted into the metal silicide layer. Because the conductivity of the material of the metal silicide layer is higher than the conductivity of the material of the initially-formed capping layer, having the metal silicide layer and the doped regions in direct contact with each other may reduce the resistance between the plugs and the doped regions along the current path from the plugs to the doped regions.

The conductive ions in the capping layer are used to diffuse into the plurality of doped regions through an annealing process such that the doped regions may contain conductive ions. In order to ensure a relatively high concentration of the conductive ions in the doped regions after the annealing process, not only a high concentration of the conductive ions is required for the capping layer prior to performing the annealing process, but also a relatively large thickness is required for the capping layer. As such, the capping layer may contain a relatively large amount of conductive ions and the concentration of the conductive ions may be high. Therefore, a sufficient amount of the conductive ions may be diffused into the doped regions during the annealing process.

Because the thickness of the capping layer is relatively large and the metal silicide layer needs to be in direct contact with the doped regions, the thickness of the formed metal silicide layer may be large. In a direction of current conduction from the plugs to the doped regions, the resistance of the metal silicide layer may be large, which may lead to large contact resistance between the plugs and the doped regions. Therefore, the performance of the semiconductor device may be degraded.

Figure 7:
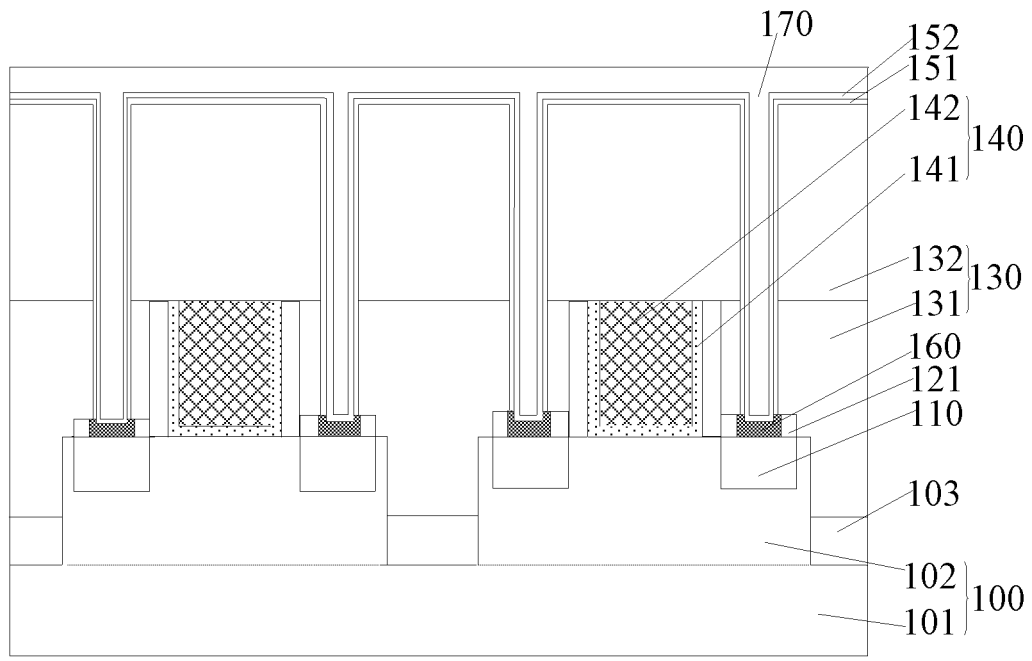
Figure 8:
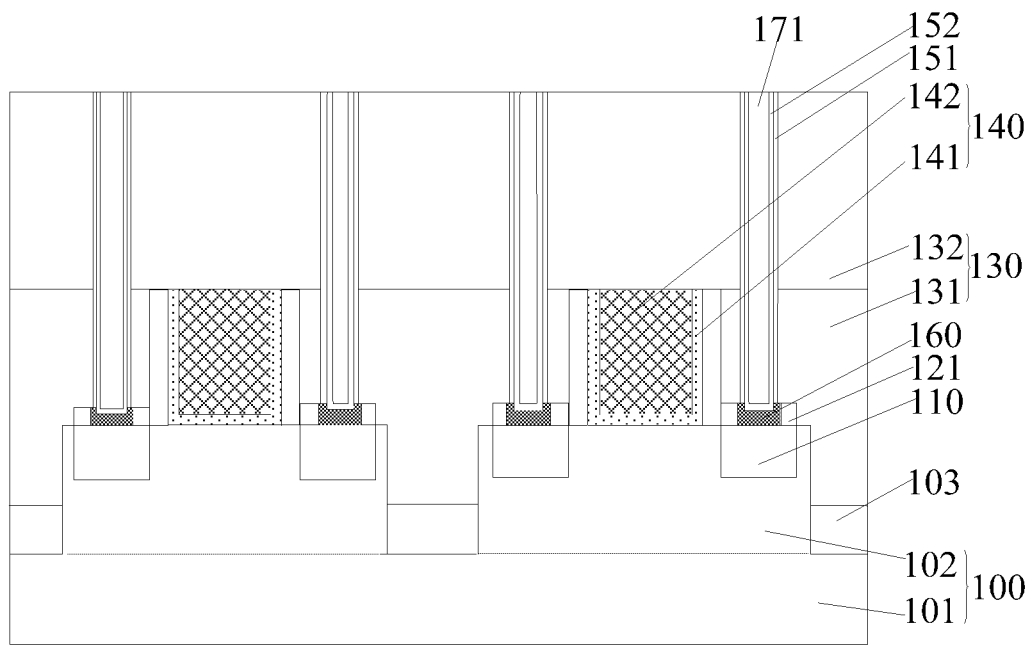
Figure 9:
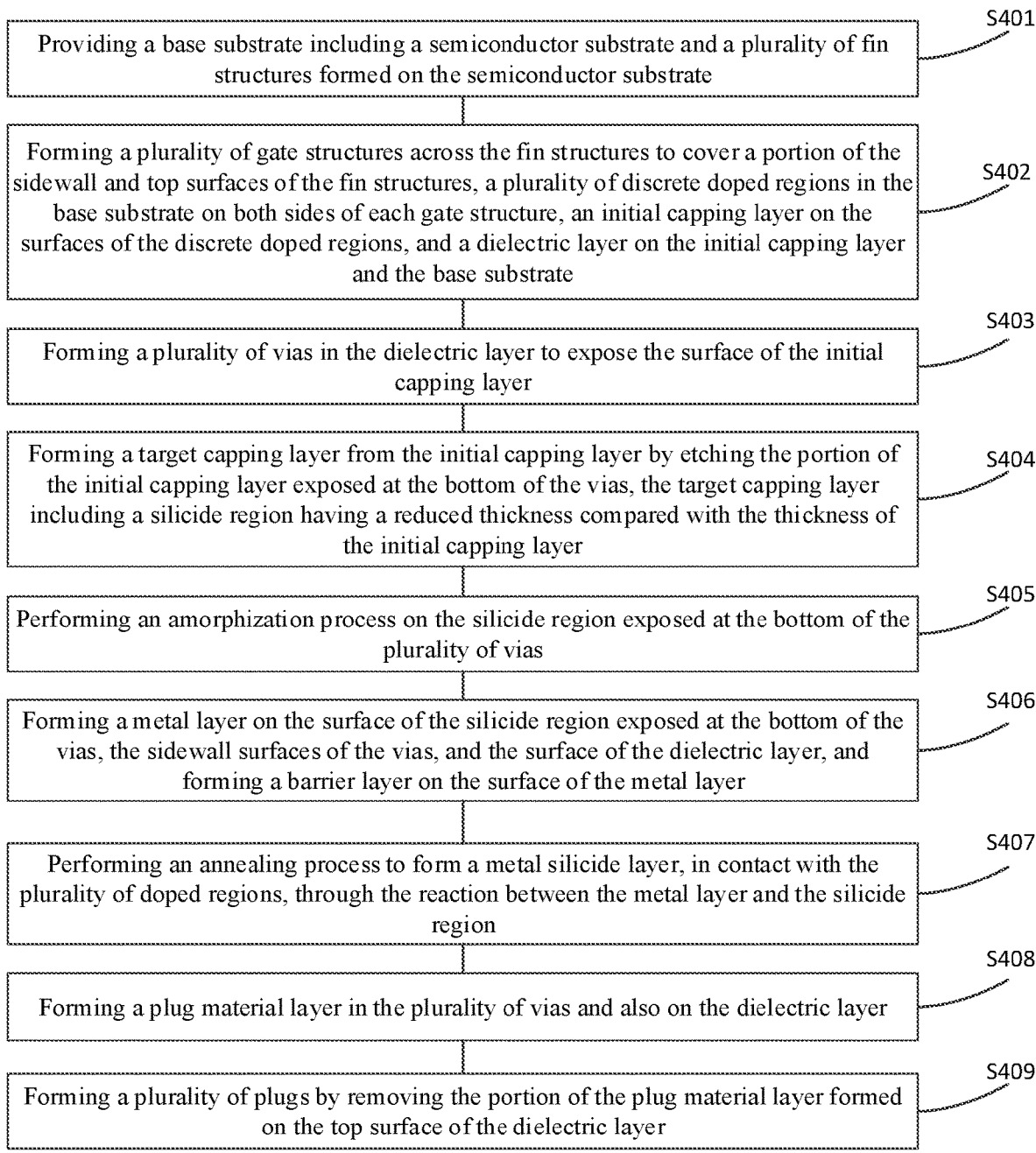
FIG. 9 illustrates a flowchart of the exemplary method for fabricating a semiconductor device consistent with various embodiments of the present disclosure.

The present disclosure provides semiconductor devices and methods for fabricating the semiconductor devices. FIG. 9 illustrates a flowchart of the exemplary method for fabricating a semiconductor device consistent with various embodiments of the present disclosure. FIGS. 1-8 illustrate schematic views of semiconductor structures at certain stages of the exemplary fabrication method.

Referring to FIG. 9, at the beginning of the fabrication process, a base substrate, including a semiconductor substrate and a plurality of fin structures formed on the semiconductor substrate, may be provided (S401). FIG. 1 illustrates a schematic cross-section view of a semiconductor structure consistent with some embodiments of the present disclosure.

Referring to FIG. 1, a base substrate 100 may be provided. In one embodiment, the semiconductor structure to be formed may be a fin field-effect transistor (Fin-FET) device. In other embodiments, the semiconductor device to be formed may be a device of planar MOS transistors, triodes, and/or diodes.

In one embodiment, the base substrate 100 may include a semiconductor substrate 101 and a plurality of fin structures 102 formed on the semiconductor substrate 101. In other embodiments, the base substrate may be a planar semiconductor substrate.

In one embodiment, the semiconductor substrate 101 may be made of single-crystalline silicon, poly-crystalline silicon, or amorphous silicon. Alternatively, the semiconductor substrate 101 may be made of silicon, germanium, SiGe, GaAs, or other semiconductor material. Moreover, the semiconductor substrate 101 may have a single layer structure or a composite structure, such as silicon on insulator (SOI), etc. In one embodiment, the semiconductor substrate 101 is made of silicon.

The plurality of fin structures 102 may be formed by patterning the semiconductor substrate 101. Alternatively, the plurality of fin structures 102 may be formed by a process including forming a fin structure material layer on the semiconductor substrate 101 and then patterning the fin structure material layer to form the plurality of fin structures 102.

In one embodiment, an isolation structure 103 may be formed on the semiconductor substrate 101 to cover a portion of the sidewall surfaces of the plurality of fin structures 102. The top surface of the isolation structure 103 may be lower than the top surfaces of the fin structures 102. The isolation structure 103 may be made of a material including $SiO_x$.

The number of the plurality of fin structures 102 may be one or more than one. For illustrative purpose, two fin structures 102 are shown in FIG. 1 to illustrate the disclosed exemplary fabrication method.

Further, returning to FIG. 9, a plurality of gate structures may be formed across the plurality of fin structures, a plurality of discrete doped regions may be formed in the base substrate, an initial capping layer may be formed on the surfaces of the discrete doped regions, and a dielectric layer may be formed on the initial capping layer and the base substrate (S402). The semiconductor structure shown in FIG. 1 includes a plurality of gate structures, a plurality of discrete doped regions, an initial capping layer, and a dielectric layer consistent with some embodiments of the present disclosure.

Referring back to FIG. 1, a plurality of gate structures 140, a plurality of discrete doped regions 110, an initial capping layer 120, and a dielectric layer 130 may be formed.

The plurality of gate structures 140 may be formed on the base substrate 100 across the plurality of fin structures 102. The plurality of gate structures 140 may cover a portion of the sidewall and top surfaces of each fin structure 102 as well as a portion of top surface of the isolation structure 103 between adjacent fin structures 102. The plurality of discrete doped regions 110 may be formed in the base substrate 100 on the two sides of each gate structure 140. The initial capping layer 120 may be formed on the surface of the doped regions 110. The dielectric layer 130 may be formed on the initial capping layer 120 and the base substrate 100. The dielectric layer 130 may also be formed on the plurality of gate structures 140 as well as the isolation structure 103.

In one embodiment, the gate structure 140 may be formed across a plurality of fin structures 102 along the extending direction of the gate structure 140. In other embodiments, the gate structure 140 may be formed only across one fin structure 102 along the extending direction of the gate structure 140.

The gate structure 140 may include a gate dielectric layer 141 formed across the fin structure 102 and a gate electrode layer 142 formed on the gate dielectric layer 141. The gate dielectric layer may cover a portion of the surface of the isolation structure 103 and a portion of the sidewall and top surfaces of the fin structure 102.

The gate dielectric layer 141 may be made of a high-k (e.g., k>3.9) dielectric material. The gate electrode layer 142 may be made of a metal.

The dielectric layer 130 may include a first interlayer dielectric layer 131 and a second interlayer dielectric layer 132. The first interlayer dielectric layer 131 may be formed on the semiconductor substrate 101 and the isolation structure 103, and may cover the plurality of fin structures 102, the initial capping layer 120, and the sidewall surfaces of the plurality of gate structures 140. The second interlayer dielectric layer 132 may be formed on the first interlayer dielectric layer 131 and the top surfaces of the plurality of gate structures 140.

In one embodiment, the dielectric layer 130 may be made of a material including $SiO_x$.

The plurality of gate structures 140, the plurality of doped regions 110, the initial capping layer 120, and the dielectric layer 130 may be formed by a process including the following exemplary steps. A plurality of dummy gate structures may be formed on the base substrate 100. For example, the plurality of dummy gate structures may be formed on the semiconductor substrate 101 and the isolation structure 103 and across the plurality of fin structures 102. The plurality of dummy gate structures may cover a portion of the top and the sidewall surfaces of each fin structure 102. Further, a pre-doped layer may be formed in the base substrate 100 on the two sides of each dummy gate structure. For example, the pre-doped layer may be formed in the fin structure 102 on both sides of each dummy gate structure. An initial capping layer 120 may then be formed on the surface of the pre-doped layer with the initial capping layer 120 containing conductive ions. Further, an annealing process may be performed to diffuse the conductive ions in the initial capping layer 120 to the pre-doped layer such that the pre-doped layer may form a plurality doped regions 110. A first interlayer dielectric layer 131 may be formed to cover the initial capping layer 120 and the sidewall surfaces of the plurality of dummy gate structures. The first interlayer dielectric layer 131 may also cover the base substrate 100. After forming the first interlayer dielectric layer 131, the plurality of dummy gate structures may be removed to form a plurality of gate-structure openings. A plurality of gate structures 140 may be formed in the plurality of gate-structure openings. Moreover, a second interlayer dielectric layer 132 may be formed on the first interlayer dielectric layer 131 and the plurality of gate structures 140.

In one embodiment, the initial capping layer 120 may be made of polycrystalline silicon doped with conductive ions.

Prior to performing the annealing process, the concentration of the conductive ions in the initial capping layer 120 may be in a range of approximately 5E20 atom/cm$^3$ to 5E21 atom/cm$^3$. After performing the annealing process, the concentration of the conductive ions in the doped regions 120 may be in a range of approximately 3E20 atom/cm$^3$ to 1E21 atom/cm$^3$.

In one embodiment, the semiconductor device to be formed may be a P-type transistor device. Accordingly, the pre-doped layer may be made of SiGe, and the plurality of doped regions 110 may be made of SiGe containing conductive ions. The conductive ions may be P-type conductive ions, such as B ions and In ions. In one embodiment, the ratio of the mole number of germanium atoms to the mole number of silicon atoms may be in a range of approximately 35% to 55%.

In other embodiments, the semiconductor device to be formed may be an N-type transistor device. Accordingly, the pre-doped layer may be made of silicon, and the plurality of doped regions may be made of silicon containing conductive ions. The conductive ions may be N-type conductive ions, such as P ions and As ions.

In one embodiment, the conductive ions in the initial capping layer 120 may diffuse to the pre-doped layer such that the formed doped regions 110 may contain conductive ions. Forming the plurality of doped regions through the process described above may have the following advantages. According to the disclosed fabrication method, implanting ions into the pre-doped layer to introduce conductive ions may be avoided, and thus implantation loss may be avoided. When the semiconductor device to be formed is a P-type device, and conductive ions are introduced into the doped regions 110 using an in-situ doping method, the amount of the conductive ions entering the pre-doped layer during the in-situ doping process may not be sufficiently because the mole ratio of germanium is relatively high in the pre-doped layer. However, according to the disclosed method, prior to performing the annealing process, the concentration of the conductive ions in the initial capping layer 120 may be large, and the conductive ions in the initial capping layer 120 may easily diffuse into the pre-doped layer during the annealing process. Therefore, the concentration of the conductive ions in the doped regions 110 may be high.

In one embodiment, prior to the annealing process, the concentration of the conductive ions in the initial capping layer 120 may be high. Moreover, the annealing temperature adopted for the annealing process may be high, and thus may have a stronger driving effect on the diffusion of the conductive ions. Therefore, the conductive ions in the initial capping layer 120 may be easily diffused into the pre-doped layer to form the plurality of doped regions 110 during the annealing process.

The annealing temperature adopted in the annealing process may be higher than the temperature adopted in an epitaxial growth process that can be used to form doped regions 110. In one embodiment, the annealing temperature adopted in the annealing process may be in a range of approximately 900° C. to 1100° C., such as 1000° C.

In one embodiment, the thickness of the initial capping layer 120 may be in a range of approximately 8 nm to 15 nm. A thickness of the initial capping layer 120 larger than 15 nm may result in process waste and large parasitic capacitance, and may also lead to a small fillable space between adjacent fin structures 202 crossed by the gate structures 140. As such, in a subsequent process, the first interlayer dielectric layer 131 may not be easily filled into the space between adjacent fin structures 202 crossed by the gate structures 140. A thickness of the initial capping layer 120 smaller than 8 nm may cause the total amount of the conductive ions in the initial capping layer 120 too small. As the total amount of the conductive ions in the initial capping layer 120 that can diffuse into the pre-doped layer becomes smaller, the formed doped regions 110 may unlikely have a high concentration of the conductive ions.

Figure 2:
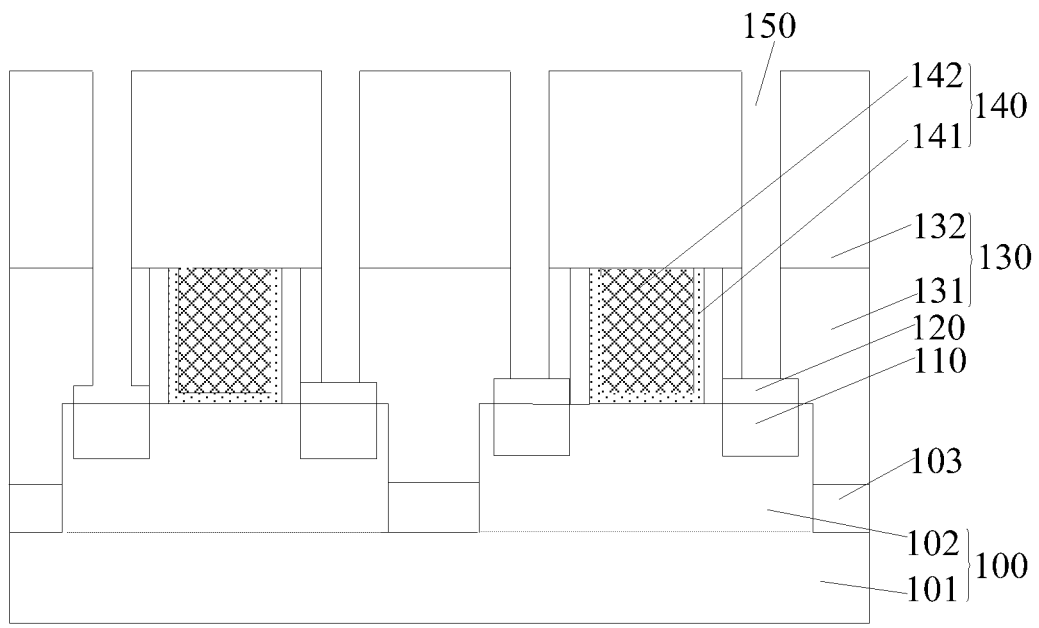

Further, returning to FIG. 9, a plurality of vias may be formed in the dielectric layer to expose the surface of the initial capping layer (S403). FIG. 2 illustrates a schematic cross-section view of a semiconductor structure consistent with some embodiments of the present disclosure.

Referring to FIG. 2, a plurality of vias 150 may be formed in the dielectric layer 130. The plurality of vias 150 may expose the surface of the initial capping layer 120 formed on the plurality of doped regions 110. For example, the plurality of vias 150 may be formed in the dielectric layer 130 on the two sides of each gate structure 140. The plurality of vias 150 may expose the surface of the initial capping layer 120.

Figure 3:
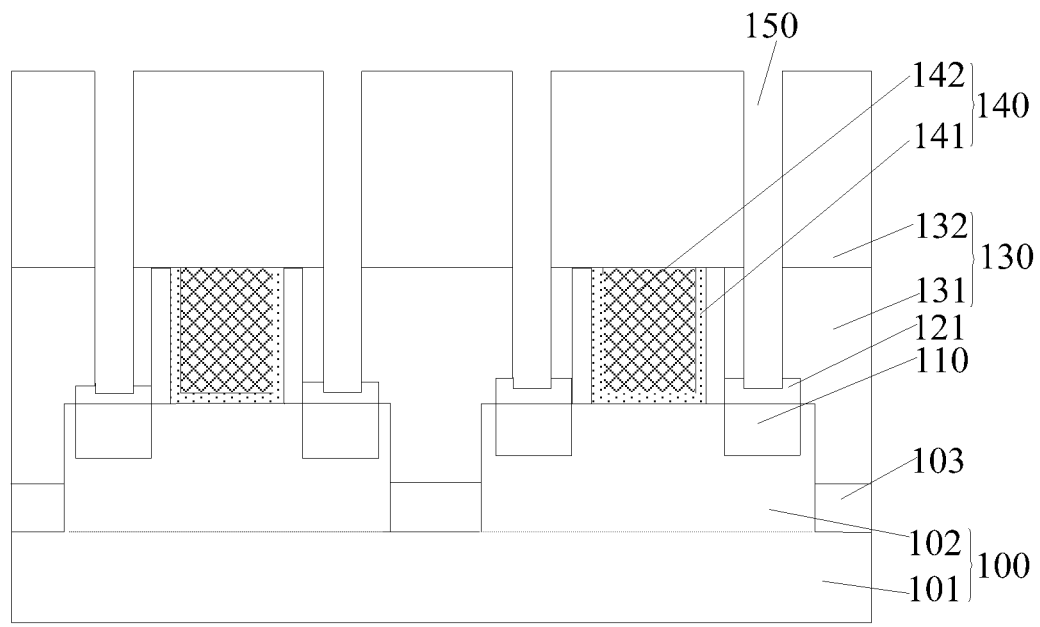

Further, returning to FIG. 9, the initial capping layer at the bottom of the vias may be etched to form a target capping layer (S404). FIG. 3 illustrates a schematic cross-section view of a semiconductor structure consistent with some embodiments of the present disclosure.

Referring to FIG. 3, the initial capping layer 120 at the bottom of the vias 150 may be etched to form a target capping layer 121. The target capping layer 121 may include a silicide region exposed at the bottom of the plurality of vias 150. The thickness of the silicide region may be smaller than the thickness of the initial capping layer 120.

The process to etch the initial capping layer 120 at the bottom of the plurality of vias 150 may be an anisotropic dry etching process.

The target capping layer 121 may include a silicide region exposed by a via 150 and a non-silicide region formed on the top of each doped region 110. The silicide region may be surrounded by the non-silicide region, and the thickness of the silicide region may be smaller than the thickness of the non-silicide region. In one embodiment, only a portion of the initial capping layer 120 may be exposed at the bottom of a corresponding via 150. Therefore, after the target capping layer 121 is formed by etching the initial capping layer 120, the formed target capping layer 121 may have a reduced, smaller thickness at the bottom of the via 150 as compared to the thickness of the initial capping layer 120. The portion of the target capping layer 121 exposed at the bottom of the via 150 may be the silicide region, and other portion of the target capping layer 121 may be the non-silicide region.

In a subsequently-performed self-aligned silicide process, the thickness of the metal silicide layer may be small. In order to ensure that the metal silicide layer and the doped regions 110 are in direct contact with each other, the thickness of the initial capped layer 120 at the bottom of the plurality of vias 150 may need to be reduced.

Figure 4:
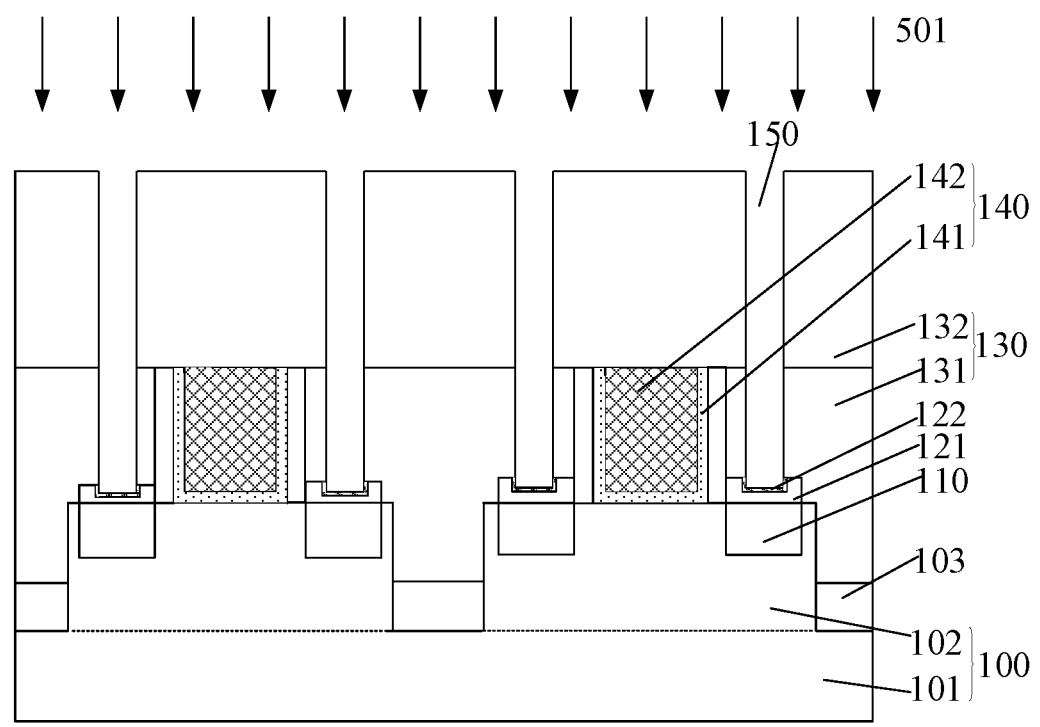

Further, returning to FIG. 9, an amorphization process may be performed on the silicide region exposed at the bottom of the plurality of vias (S405). FIG. 4 illustrates a schematic diagram of performing an amorphization process consistent with some embodiments of the present disclosure.

Referring to FIG. 4, in one embodiment, prior to performing the self-aligned silicide process, the fabrication process may also include performing an amorphization process 501 on the silicide region exposed at the bottom of the vias 150. In other embodiments, the silicide region exposed at the bottom of the vias may not be amorphized.

In one embodiment, the amorphization process 501 may be used to amorphize the material surface of the silicide region exposed at the bottom of the vias 150 such that the surface roughness of the metal silicide layer formed in a subsequent process may be low.

By performing the amorphization process 501 on the silicide region exposed by the vias 150, an amorphous layer 122 may be formed on the surface of the silicide region at the bottom of the vias 150.

The amorphization process 501 may include an ion-implantation process.

In one embodiment, the ions used in the ion implantation process may be ions that are non-N-type and non-P-type. For example, the ions used in the ion implantation process are carbon ions or germanium ions. Because carbon ions and germanium ions are neither N-type ions nor P-type ions, using carbon ions or germanium ions in the ion implantation process may have less effect on the electrical performance of the plurality of doped regions 110.

In a subsequent process, a self-aligned silicide process may be performed to form a metal silicide layer in the silicide region. The metal silicide layer and the plurality of doped regions 110 may be in contact with each other.

The self-aligned silicide process may include forming a metal layer on the surface of the portion of the silicide region exposed by the plurality of vias 150, and then performing an annealing process to allow the metal layer and the silicide region to react with each other and thus form the metal silicide layer.

Additionally and optionally, a barrier layer may also be formed on the sidewall surfaces of the plurality of vias 150 and the surface of the metal silicide layer. In one embodiment, the barrier layer may be formed during the formation of the metal silicide layer. In other embodiments, the barrier layer may be formed after forming the metal silicide layer. In the following, a detailed fabrication process for the barrier layer and the metal silicide layer consistent with some embodiments of the present disclosure is provided.

Figure 5:
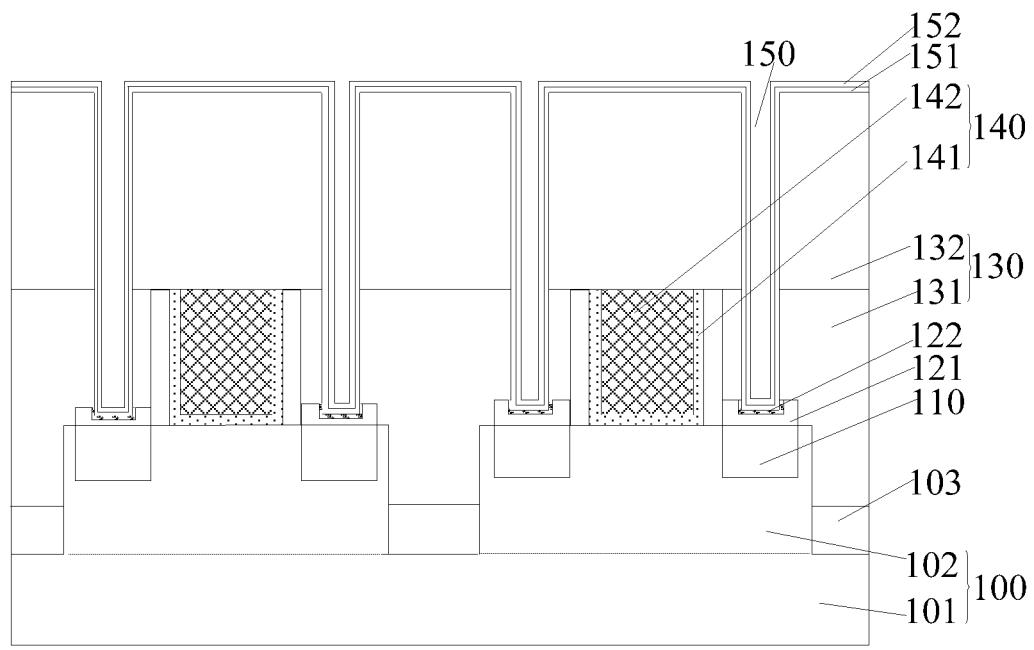

Referring to FIG. 9, a metal layer may be formed on the surface of the silicide region exposed at the bottom of the vias, the sidewall surfaces of the vias, and the surface of the dielectric layer, and a barrier layer may be formed on the surface of the metal layer (S406). FIG. 5 illustrates a schematic cross-section view of a semiconductor structure consistent with some embodiments of the present disclosure.

Referring to FIG. 5, a metal layer 151 may be formed on the surface of the silicide region exposed at the bottom of the vias 150, the sidewall surfaces of the vias 150, and the surface of the dielectric layer 130. A barrier layer 152 may then be formed on the surface of the metal layer 151.

The metal layer 151 may be made of a material including titanium. The barrier layer 152 may be made of a material including $TiN_x$.

The metal layer 151 may be formed by a deposition process, such as sputtering process. The barrier layer 152 may be formed by a deposition process such as sputtering process, chemical vapor deposition (CVD) process, and atomic layer deposition (ALD) process.

Figure 6:
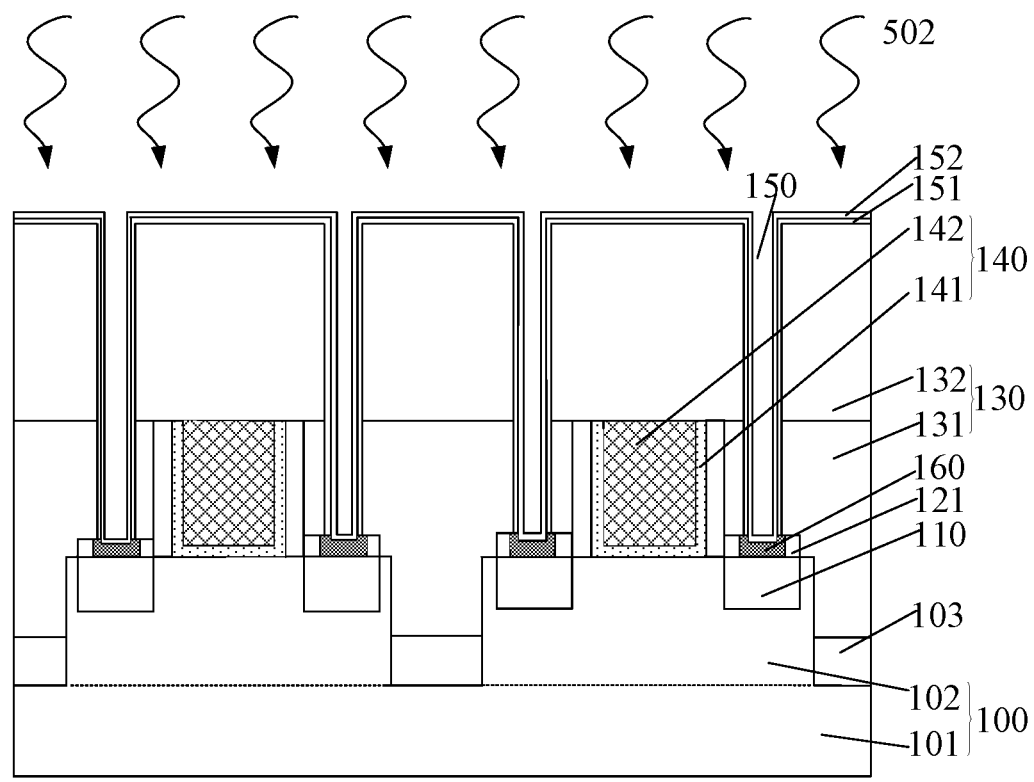

Further, returning to FIG. 9, an annealing process may be performed to form a metal silicide layer through the reaction between the metal layer and the silicide region, and the metal silicide layer may be in contact with the plurality of doped regions (S407). FIG. 6 illustrates a schematic cross-section view of a semiconductor structure consistent with some embodiments of the present disclosure.

Referring to FIG. 6, an annealing process 502 may be performed. During the annealing process 502, the metal layer 151 may react with the silicide region and thus form a metal silicide layer 160. The metal silicide layer 160 may be in contact with the plurality of doped regions 110.

When the meal layer 151 is made of titanium, the metal silicide layer 160 may be made of $TiSi_x$. As such, there are fewer defects in the metal silicide layer 160 formed by the reaction between the metal layer 151 and the silicide region.

The metal silicide layer 160 may be in direct contact with the plurality of doped regions 110, that is, the silicide region between a plurality of subsequently-formed plugs and the doped regions 110 may be fully converted into the metal silicide layer 160. Because the conductivity of the material of the metal silicide layer 160 is higher than the conductivity of the material in the silicide region, having the metal silicide layer 160 and the doped regions 110 in direct contact with each other may reduce the resistance between the plugs and the doped regions 110 along the current path from the plugs to the doped regions 110.

In one embodiment, after performing the amorphization process 501 on the silicide region exposed at the bottom of the vias 150, the surface roughness of the formed metal silicide layer 160 may be reduced. Therefore, the contact resistance between the doped regions 110 and a plurality of subsequently-formed plugs may be further reduced.

In one embodiment, a portion of the initial capping layer 120 (referring to FIG. 2) at the bottom of the vias 150 may be removed through etching such that the formed target capping layer 121 may have a thickness smaller than the thickness of the initial capping layer 120. Therefore, the thickness of the silicide region may be small. Because the silicide region at the bottom of the vias 150 may form the metal silicide layer 160 through the self-aligned silicide process, the thickness of the formed metal silicide layer 160 may also be small. Further, after forming a plurality of plugs in the vias 150 in a subsequent process, the resistance of the metal silicide layer 160 along the current path from the plugs to the doped regions 110 may be small, and thus the contact resistance between the plugs and the doped regions 110 may be reduced.

The thickness of the silicide region may not be too small; otherwise, it may be difficult to induce the phase transition of the material through the reaction between the silicide region and the metal layer 151, and thus forming the metal silicide layer 160 through the phase transition may be unlikely.

When the metal layer 151 is made of titanium, the thickness of the silicide region may need to be greater than or equal to 2 nm. In one embodiment, the thickness of the silicide region may be in a range of approximately 2 nm to 6 nm.

After forming the metal silicide layer 160, a plurality of plugs may be formed in the plurality of vias 150.

Returning to FIG. 9, after forming the metal silicide layer, a plug material layer may be formed in the plurality of vias and also on the dielectric layer (S408). FIG. 7 illustrates a schematic cross-section view of a semiconductor structure consistent with some embodiments of the present disclosure.

Referring to FIG. 7, a plug material layer 170 may be formed in the plurality of vias 150 (referring to FIG. 6). The plug material layer 170 may also cover the surface of the dielectric layer 130.

The plug material layer 170 may be made of a metal. For example, the plug material layer 170 may be made of tungsten. The plug material layer may be formed by a deposition process, such as a CVD process.

In one embodiment, the plug material layer 170 may also cover the metal layer 151 and the barrier layer 152 formed on the sidewall surfaces of the vias 150 and also cover the metal layer 151 and the barrier layer 152 formed on the top surface of the dielectric layer 130.

Further, returning to FIG. 9, the portion of the plug material layer formed on the top surface of the dielectric layer may be removed to form a plurality of plugs (S409). FIG. 8 illustrates a schematic cross-section view of a semiconductor structure consistent with some embodiments of the present disclosure.

Referring to FIG. 8, a plurality of plugs 171 may be formed by removing the portion of the plug material layer 170 (referring to FIG. 7) formed on the top surface of the dielectric layer 130.

In one embodiment, during the process to remove the portion of the plug material layer 170 formed on the top of the dielectric layer 130, the portion of the metal layer 151 and the barrier layer 152 formed on the top of the dielectric layer 130 may also be removed. As such, the fabrication process may be simplified.

After forming the plurality of plugs 171, the barrier layer 152 may remain between each plug 171 and the metal silicide layer 160 and also between each plug 171 and the dielectric layer 130. The barrier layer 52 may be used to prevent diffusion of the atoms in the plug 171.

The present disclosure also provides a semiconductor device. FIG. 6 illustrates an exemplary semiconductor device consistent with some embodiments of the present disclosure.

Referring to FIG. 6, the semiconductor device may include a base substrate 100, a plurality of discrete doped regions formed in the base substrate 100, and a target capping layer 121 formed on the surfaces of the doped regions 110. The target capping layer 121 may include a silicide region (e.g., for forming a metal silicide layer 160) and a non-silicide region surrounding the silicide region. The silicide region and the non-silicide region may be formed on the surfaces of the doped regions 110, and the thickness of the silicide region may be smaller than the thickness of the non-silicide region. In one embodiment, the silicide region of the target capping layer 121 may be used to form the metal silicide layer 160, and the metal silicide layer 160 may be in contact with the plurality of doped regions 110. Further, the semiconductor device may also include a dielectric layer formed on the target capping layer 121, the metal silicide layer 160, and the base substrate 100. In addition, the semiconductor device may also include a plurality of vias 150 formed in the dielectric layer 130. The plurality of vias 150 may expose the metal silicide layer 160.

The non-silicide region of the target capping layer 121 may be made of polycrystalline silicon doped with conductive ions. The thickness of the non-silicide region of the target capping layer 121 may be in a range of 8 nm to 15 nm. The metal silicide layer 160 (i.e., formed from the entire silicide region of the target capping layer 121) may be made of a material including $TiSi_x$. The thickness of the metal silicide layer 160 (i.e., the silicide region of the target capping layer 121) may be larger than 2 nm. In one embodiment, the thickness of the metal silicide layer 160 may be in a range of approximately 2 nm to 6 nm. In one embodiment, a surface layer of the metal silicide layer 160 exposed in each via 150 may be amorphized through an amorphization process performed on the silicide region. Through the amorphization process, the surface roughness of the formed metal silicide layer 160 may be reduced. Therefore, the contact resistance between the doped regions 110 and a plurality of subsequently-formed plugs may be further reduced. The detailed description of the disclosed semiconductor device may be referred to the corresponding content provided in the above embodiments.

Compared to conventional semiconductor devices and fabrication methods, the disclosed semiconductor devices and fabrication methods may demonstrate advantages.

According to the disclosed semiconductor devices and fabrication methods, the surface of the metal silicide layer is used for making contact with the plurality of plugs. Because the metal silicide layer is in direct contact with the doped regions, and the conductivity of the material of the metal silicide layer is higher than the conductivity of the material of the initial capping layer, the resistance between the plugs and the doped regions along the current path from the plugs to the doped regions may be reduced. Moreover, because a portion of the initial capping layer at the bottom of the vias is removed to form the target capping layer, the thickness of the silicide region in the formed target capping layer is smaller than the thickness of the initial capping layer, that is, the thickness of the silicide region may be relatively small. Because the silicide region at the bottom of the vias is further used to form a metal silicide layer through a self-aligned silicide process, the thickness of the formed metal silicide layer at the bottom of the vias may also be relatively small. As such, along the current path direction from the metal silicide layer to the doped regions, the resistance of the metal silicide layer may be small, and thus the contact resistance between the plugs and the doped regions may be reduced. Therefore, the electrical performance of the formed semiconductor device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a base substrate;
   forming a plurality of doped regions in the base substrate;
   forming an initial capping layer covering surfaces of the plurality of doped regions;

forming a dielectric layer on the initial capping layer and the base substrate;

forming a plurality of vias in the dielectric layer to expose a surface portion of the initial capping layer;

etching the exposed surface portion of the initial capping layer at a bottom of each via to form a silicide region exposed at the bottom of the via, the silicide region having a reduced thickness compared with a thickness of the initial capping layer; and forming a metal silicide layer by performing a self-aligned silicide process on an entire silicide region, such that the metal silicide layer is in contact with the plurality of doped regions.

2. The method according to claim 1, further including:

forming a plurality of gate structures prior to forming the vias, and, the plurality of gate structures are formed on the base substrate;

the doped regions are located in the base substrate on both sides of each gate structure;

the dielectric layer is also formed on the plurality of gate structures; and the vias are formed in the dielectric layer on both sides of each gate structure.

3. The method according to claim 2, wherein:

the base substrate includes a semiconductor substrate and a plurality of fin structures formed on the semiconductor substrate, and, the plurality of gate structures are formed across the plurality of fin structures to cover a portion of sidewall and top surfaces of the fin structures; and the plurality of doped regions are formed in the fin structures on both sides of each gate structure.

4. The method according to claim 1, wherein:

etching the exposed surface portion of the initial capping layer includes an anisotropic dry etching process.

5. The method according to claim 1, wherein:

the initial capping layer are made of polycrystalline silicon doped with conductive ions.

6. The method according to claim 1, wherein:

the thickness of the initial capping layer is in a range of approximately 8 nm to 15 nm.

7. The method according to claim 1, wherein the self-aligned silicide process includes:

forming a metal layer on the silicide region exposed at the bottom of the vias; and performing an annealing process to allow the metal layer and the silicide region to react and form the metal silicide layer.

8. The method according to claim 7, wherein:

the metal layer is made of a material including titanium; and the metal silicide layer is made of a material including $TiSi_x$.

9. The method according to claim 8, wherein:

the reduced thickness of the silicide region is in a range of approximately 2 nm to 6 nm.

10. The method according to claim 2, wherein the dielectric layer includes a first interlayer dielectric layer and a second interlayer dielectric layer, and forming the plurality of gate structures, the plurality of doped regions, the initial capping layer, and the dielectric layer includes:

forming a plurality of dummy gate structures on the base substrate;

forming a pre-doped layer in the base substrate on both sides of each dummy gate structure;

forming the initial capping layer on the pre-doped layer, wherein the initial capping layer contains conductive ions;

performing an annealing process to diffuse the conductive ions in the initial capping layer into the pre-doped layer to form the plurality doped regions from the pre-doped layer;

forming the first interlayer dielectric layer on the base substrate to cover the initial capping layer and sidewall surfaces of the plurality of dummy gate structures;

forming a plurality of gate-structure openings by removing the plurality of dummy gate structures after forming the first interlayer dielectric layer;

forming the plurality of gate structures in the plurality of gate-structure opening; and forming the second interlayer dielectric layer on the first interlayer dielectric layer and the plurality of gate structures.

11. The method according to claim 10, wherein:

the thickness of the initial capping layer is in a range of approximately 8 nm to 15 nm;

prior to performing the annealing process, a concentration of the conductive ions in the initial capping layer is in a range of approximately 5E20 atom/cm$^3$ to 5E21 atom/cm$^3$; and after performing the annealing process, a concentration of the conductive ions in the doped regions is in a range of approximately 3E20 atom/cm$^3$ to 1E21 atom/cm$^3$.

12. The method according to claim 10, wherein the semiconductor device is a P-type transistor device, and:

the pre-doped layer is made of SiGe;

the plurality doped regions are made of SiGe doped with conductive ions; and the conductive ions are P-type conductive ions.

13. The method according to claim 1, prior to performing the self-aligned silicide process, further including:

performing an amorphization process on the silicide region exposed at the bottom of each via to form an amorphous layer, wherein:

the amorphization process includes an ion implantation process using ions that are non-N-type and non-P-type.

14. The method according to claim 1, after forming the metal silicide layer, further including:

forming a plurality of plugs in the vias.

* * * * *